(12) United States Patent
Pan

(10) Patent No.: US 7,601,574 B2
(45) Date of Patent: Oct. 13, 2009

(54) METHODS FOR FABRICATING A STRESS ENHANCED MOS TRANSISTOR

(75) Inventor: James Pan, Fishkill, NY (US)

(73) Assignee: Globalfoundries Inc., Grand Cayman (KY)

(*) Notice: Subject to any disclaimer, the term of this patent is extended or adjusted under 35 U.S.C. 154(b) by 443 days.

(21) Appl. No.: 11/552,582

(22) Filed: Oct. 25, 2006

(65) Prior Publication Data

US 2008/0102571 A1    May 1, 2008

(51) Int. Cl.
*H01L 21/338* (2006.01)
(52) U.S. Cl. ............... 438/183; 438/595; 257/E21.444
(58) Field of Classification Search ................ 438/183, 438/184, 197, 595
See application file for complete search history.

(56) References Cited

U.S. PATENT DOCUMENTS

| 7,071,529 B2 * | 7/2006 | Miyagawa et al. ........... 257/501 |
| 7,358,551 B2 * | 4/2008 | Chidambarrao et al. ..... 257/288 |
| 7,439,120 B2 * | 10/2008 | Pei .............................. 438/197 |
| 7,462,522 B2 * | 12/2008 | Chidambarrao et al. ..... 438/183 |

* cited by examiner

*Primary Examiner*—Quoc D Hoang
(74) *Attorney, Agent, or Firm*—Ingrassia, Fisher & Lorenz, P.C.

(57) ABSTRACT

Methods are provided for fabricating a stress enhanced MOS transistor. One such method comprises the steps of depositing and patterning a layer of sacrificial material to form a dummy gate electrode and replacing the dummy gate electrode with a stressed gate electrode. After the stressed gate electrode has been formed by a replacement process, a stress liner is deposited overlying the stressed gate electrode.

20 Claims, 5 Drawing Sheets

METHODS FOR FABRICATING A STRESS ENHANCED MOS TRANSISTOR

TECHNICAL FIELD

The present invention generally relates to methods for fabricating stress enhanced MOS transistors, and more particularly relates to methods for fabricating stress enhanced MOS transistors by stressed gate replacement.

BACKGROUND

The majority of present day integrated circuits (ICs) are implemented by using a plurality of interconnected field effect transistors (FETs), also called metal oxide semiconductor field effect transistors (MOSFETs), or simply MOS transistors. An MOS transistor includes a gate electrode as a control electrode and spaced apart source and drain regions between which a current can flow. A control voltage applied to the gate electrode controls the flow of current through a channel between the source and drain regions.

The current carrying capability and hence the performance of an MOS transistor is proportional to the mobility ($\mu$) of the majority carrier in the channel. The mobility of holes, the majority carrier in a P-channel MOS (PMOS) transistor, and the mobility of electrons, the majority carrier in an N-channel MOS (NMOS) transistor, can be enhanced by applying an appropriate stress to the channel. The known stress engineering methods greatly enhance circuit performance by increasing device drive current without increasing device size and device capacitance. Unfortunately, some of the known stress engineering methods work against each other; practicing one method relaxes the stress induced by another method.

Accordingly, it is desirable to provide improved methods for fabricating stress enhanced MOS transistors. In addition, it is desirable to provide methods for fabricating MOS transistors that take advantage of multiple stress engineering methods to cumulatively enhance the stress applied to the transistor channel. Furthermore, other desirable features and characteristics of the present invention will become apparent from the subsequent detailed description and the appended claims, taken in conjunction with the accompanying drawings and the foregoing technical field and background.

BRIEF SUMMARY

Methods are provided for fabricating a stress enhanced MOS transistor. One such method comprises the steps of depositing and patterning a layer of sacrificial material to form a dummy gate electrode and replacing the dummy gate electrode with a stressed gate electrode. After the stressed gate electrode has been formed by a replacement process, a stress liner is deposited overlying the stressed gate electrode.

BRIEF DESCRIPTION OF THE DRAWINGS

The present invention will hereinafter be described in conjunction with the following drawing figures, wherein like numerals denote like elements, and wherein.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

FIGS. 1-10 illustrate, in cross section, a stress enhanced MOS transistor 20 and method steps for fabricating such an MOS transistor in accordance with various embodiments of the invention. Those of skill in the art will understand that transistor 20 is likely to be one of a large number of transistors that are interconnected in an integrated circuit. In these illustrative embodiments the exemplary MOS transistor is a stress enhanced P-channel MOS (PMOS) transistor, although similar method steps can be used to manufacture a stress enhanced N-channel MOS (NMOS) transistor as will be explained below. Likewise, similar method steps can used to manufacture stress enhanced complementary MOS (CMOS) circuits that include a plurality of stress enhanced NMOS and/or PMOS transistors with or without conventional MOS transistors, all coupled together to implement a desired integrated circuit. Various steps in the manufacture of MOS transistors are well known and so, in the interest of brevity, many conventional steps will only be mentioned briefly herein or will be omitted entirely without providing the well known process details. Although the term "MOS device" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate.

Figure 1:
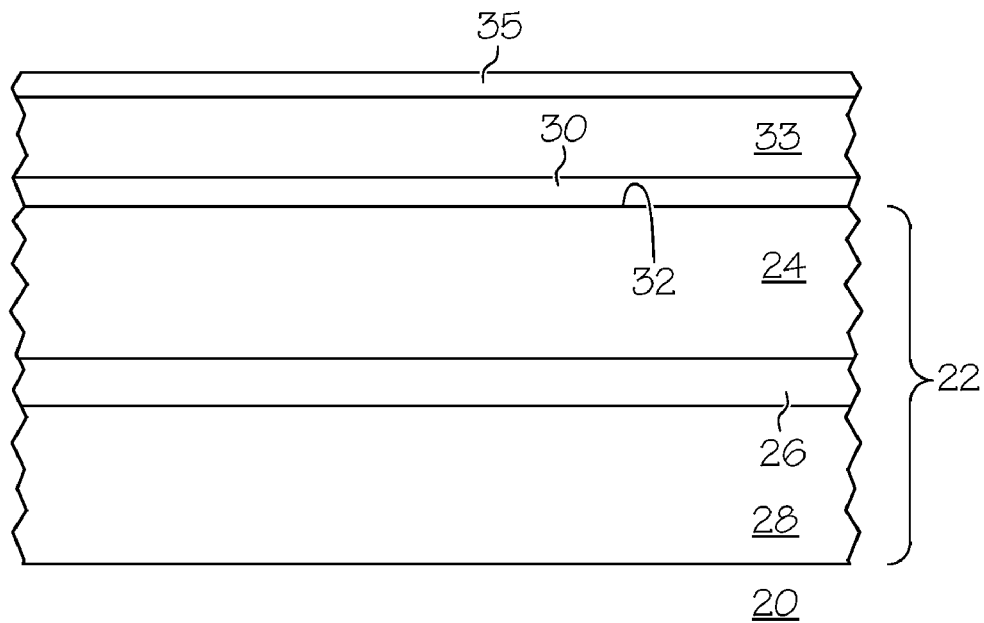
FIGS. 1-10 illustrate, in cross section, a stress enhanced MOS transistor and method steps for its fabrication in accordance with various embodiments of the invention.

As illustrated in FIG. 1, the manufacture of a stress enhanced MOS transistor 20 in accordance with an embodiment of the invention begins with providing an N-type semiconductor substrate 22 in and on which the transistor is fabricated. The initial steps in the fabrication of MOS transistor 20 are conventional and will not be described in detail. The semiconductor substrate is preferably a silicon substrate having a (100) surface crystal orientation wherein the term "silicon substrate" is used herein to encompass the relatively pure silicon materials typically used in the semiconductor industry as well as silicon admixed with small amounts of other elements such as germanium, carbon, and the like as well as impurity dopant elements such as boron, phosphorus, and arsenic. Alternatively, the semiconductor substrate can be germanium, gallium arsenide, or other semiconductor material. Semiconductor substrate 22 will hereinafter be referred to for convenience but without limitation as a silicon substrate. Silicon substrate 22 may be a bulk silicon wafer (not illustrated), or may be a thin layer of silicon 24 on an insulating layer 26 (commonly know as silicon-on-insulator or SOI) that, in turn, is supported by a carrier wafer 28. Thin silicon layer 24 typically has a thickness of about 20-100 nanometers (nm) depending on the circuit function being implemented, and preferably has a thickness of about 40-60 nm. Although not illustrated, regions of electrically isolating material such as shallow trench isolation (STI) regions can be formed to extend into and preferably entirely through the thickness of silicon layer 24 to electrically isolate between transistors of the MOS circuit as required by the circuit function being implemented. There are numerous ways to form the STI, but all of the techniques generally etch a trench into the silicon substrate, fill the trench with a dielectric material such as silicon oxide, and remove the excess dielectric material from surface 32 of the silicon substrate by a process such as chemical mechanical polishing (CMP).

A layer of gate insulator 30 is formed on surface 32 of silicon layer 24. The gate insulator may be thermally grown silicon dioxide formed by heating the silicon substrate in an oxidizing ambient or may be a deposited insulator such as a silicon oxide, silicon nitride, a high dielectric constant insulator such as HfSiO, or the like. Deposited insulators can be deposited, for example, in known manner, by chemical vapor deposition (CVD), low pressure chemical vapor deposition (LPCVD), semi-atmospheric chemical vapor deposition (SACVD), or plasma enhanced chemical vapor deposition (PECVD). The gate insulator material is typically 1-10 nm in thickness. Gate insulator 30 may form the final gate insulator of stress enhanced MOS transistor 20 or may be, in accordance with an alternate embodiment of the invention, a sacrificial gate insulator that is removed and replaced in a later step in the inventive method. For convenience, but without limitation, in this discussion gate insulator 30 will be assumed to be the final gate insulator. In accordance with one embodiment of the invention a layer of gate electrode forming material 33, preferably polycrystalline silicon, is deposited onto the layer of gate insulator. Other gate electrode forming materials can also be used, but polycrystalline silicon is the preferred material because it is easy to deposit and because techniques are well known for precisely patterning polycrystalline silicon. In addition, if the layer of gate electrode forming material is to be used as a portion of the permanent gate electrode, polycrystalline silicon can be appropriately impurity doped to provide the correct work function for establishing the desired threshold voltage of MOS transistor 20. The gate electrode forming material will hereinafter be referred to as polycrystalline silicon although those of skill in the art will recognize that other materials can also be employed. The gate electrode forming material may also be referred to as a dummy gate material for reasons that will become apparent from the following description. If the gate electrode material is polycrystalline silicon, that material is typically deposited to a thickness of about 50-200 nm and preferably to a thickness of about 100 nm by LPCVD by the hydrogen reduction of silane. In accordance with one embodiment of the invention a layer of hard mask material 35 is deposited onto the polycrystalline silicon to aid in the subsequent patterning and etching of the polycrystalline silicon layer. The hard mask material can be, for example, a layer of silicon nitride having a thickness of about 10-20 nm. The silicon nitride can be deposited, for example, by LPCVD by the reaction of dichlorosilane and ammonia.

Figure 2:
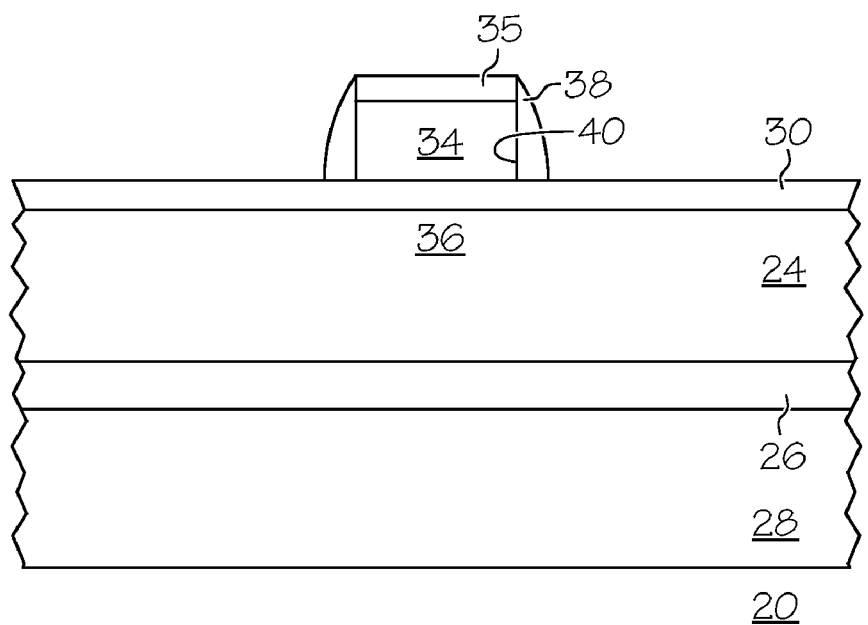

The hard mask material and the polycrystalline silicon or other gate electrode forming material are photolithographically patterned and etched to form a dummy or temporary gate electrode 34 as illustrated in FIG. 2. Dummy gate electrode 34 has substantially the same width and orientation as a permanent gate electrode to be subsequently formed by a replacement process. Dummy gate electrode 34 overlies and defines a channel 36 at the surface of silicon layer 24. Preferably the channel is oriented so that current flow along the channel of MOS transistor 20 is in the [110] direction. The length of the gate electrode determines the length of the channel. The channel length is selected based on the circuit function being implemented. Preferably the channel length is 90 nm or less and most preferably is less than 45 nm. Side wall spacers 38 are formed on the side walls 40 of dummy gate electrode 34. The sidewall spacers can be formed of an electrically insulating material such as silicon oxide, silicon nitride, silicon oxynitride, or the like. Preferably the side wall spacers are formed of silicon nitride. The side wall spacers can be formed in conventional manner by the deposition and subsequent anisotropic etching of a layer of the side wall spacer material. The anisotropic etching can be done, for example, by reactive ion etching (RIE).

Figure 3:
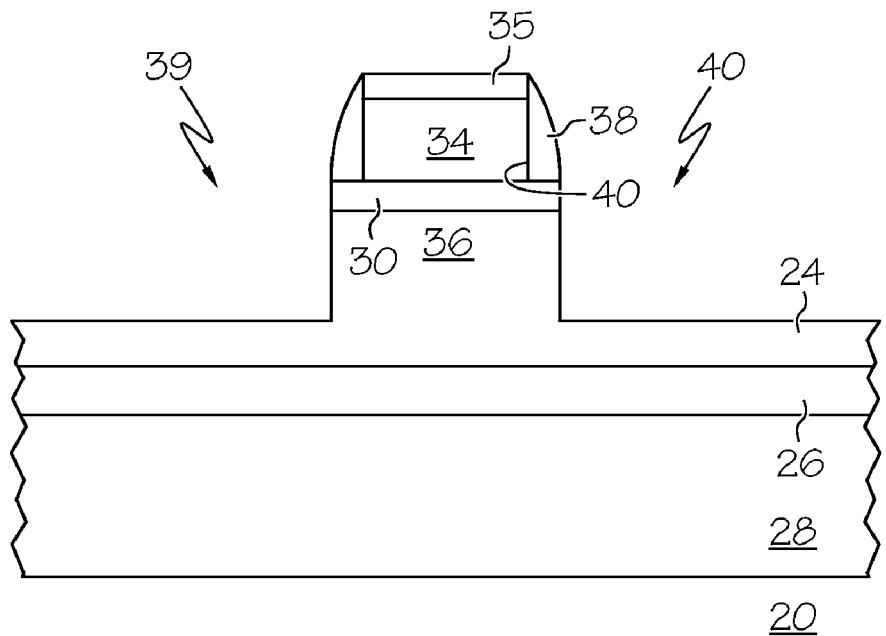

In accordance with one embodiment of the invention, dummy gate electrode 34, hard mask 35, and side wall spacers 38 are used as an etch mask and recesses 39, 40 are etched into the silicon substrate in alignment with but spaced apart from the gate electrode as illustrated in FIG. 3. Recesses 39, 40 are etched in what will become the source 42 and drain 43 regions, respectively of the transistor. The recesses can be etched, for example, by anisotropic plasma etching such as reactive ion etching using a chlorine or hydrogen bromide/oxygen chemistry. The recesses are etched to a depth of about 80% of the thickness of thin silicon layer 24, leaving a remaining portion of the layer as a seed or nucleating site for a subsequent epitaxial growth process.

Figure 4:
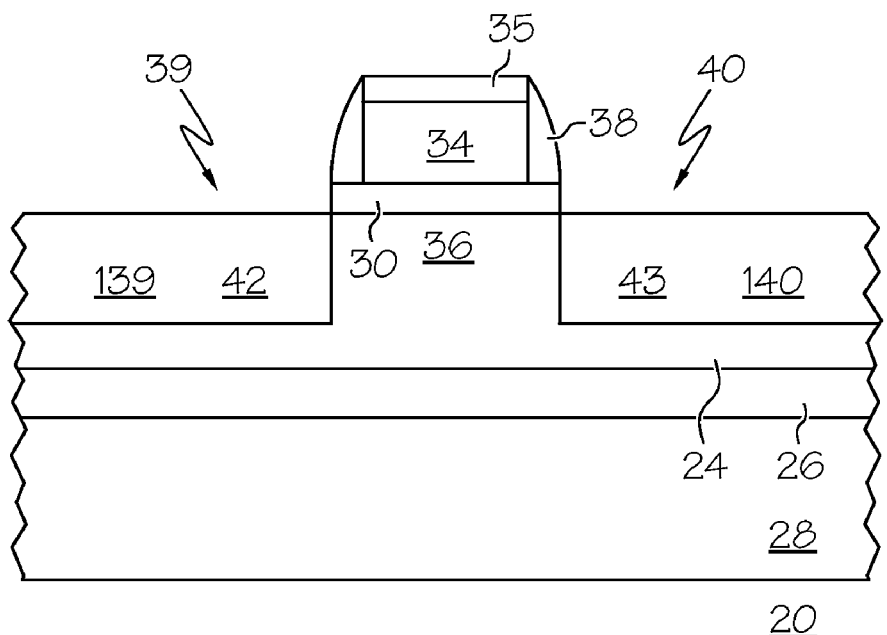

As illustrated in FIG. 4, recesses 39, 40 are filled by a process of selective epitaxial growth of monocrystalline material 139, 140, respectively. For a PMOS transistor the selective epitaxial material is preferably silicon germanium (SiGe). Selective epitaxial growth is a process by which monocrystalline material is selectively grown in the recesses using the monocrystalline silicon remaining at the bottom of the recesses as a nucleating site for the monocrystalline growth. Germanium is a larger atom than silicon, and the addition of germanium to the silicon creates a crystalline material having a larger lattice constant than the lattice constant of the host silicon layer. Growing a material in the recesses having a larger lattice constant than the lattice constant of silicon results in a compressive stress being applied to the host silicon and especially to channel 36. A compressive longitudinal stress applied to the channel of a PMOS transistor increases the mobility of majority carrier holes in the channel. The SiGe can include up to about 25% germanium, and preferably contains about 20-25% germanium. NMOS transistors can be fabricated in a similar manner. For an NMOS transistor silicon layer 24 is impurity doped P-type and the recesses 39, 40 are filled by selective epitaxial growth of a monocrystalline material such as silicon carbon (SiC) having a smaller lattice constant than the lattice constant of silicon. Carbon is a smaller atom than silicon and the addition of carbon to silicon creates a crystalline material having a smaller lattice constant than that of silicon. Filling recesses 39 and 40 with a monocrystalline material such as SiC results in a tensile stress being applied to channel 36. A tensile longitudinal stress increases the mobility of majority carrier electrons in the channel of an NMOS transistor. The SiC can include up to about 15% carbon and preferably includes about 2-7% carbon. For either a PMOS transistor or an NMOS transistor, impurity doping elements can be added to the epitaxial growth reactants to appropriately dope the source and drain regions. For example, boron can be added to the reactants during the epitaxial growth of SiGe and arsenic or phosphorus can be added to the reactants during the epitaxial growth of SiC. Alternatively, the source and drain regions can subsequently be impurity doped by ion implantation using the side wall spacers as ion implantation masks. The impurity doped SiGe or SiC or the ion implanted portions of the epitaxially grown regions form the source 42 and drains 43 regions of MOS transistor 20. If recesses in the source and drain regions are not etched and refilled by materials such as SiGe or SiC, the source and drain regions can be impurity doped in conventional manner by ion implantation. Although only one set of side wall spacers have been illustrated and only one ion implantation has been discussed, those of skill in the art will understand that additional side wall spacers and additional ion implantations can be used to form source-drain extensions, halo implants, set threshold values, and the like.

Figure 5:
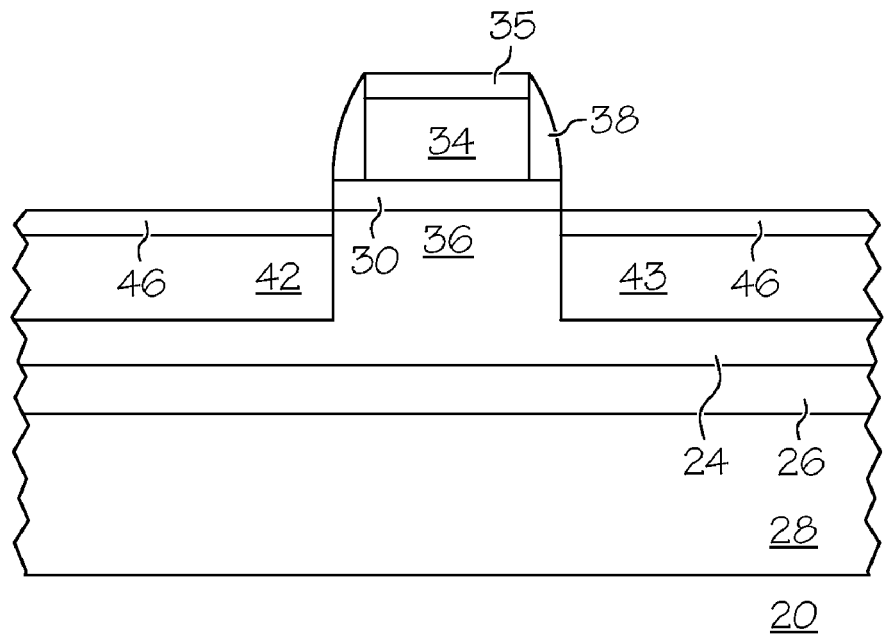

The side wall spacers can be used as a cleaning mask to remove any contaminants from the exposed surface of the source and drain regions. A layer of silicide forming metal (not illustrated) such as cobalt, nickel, or the like is blanket deposited over the entire structure. The layer of silicide forming metal is heated, for example by rapid thermal annealing (RTA), to cause the metal that is in contact with silicon to react with the silicon to form a metal silicide layer 46 contacting source region 42 and drain region 43 as illustrated in FIG. 5. Any of the metal that is not in contact with silicon remains unreacted and is subsequently removed, for example, by wet etching in a $H_2O_2/H_2SO_4$ or $HNO_3/HCl$ solution.

In prior art structures a stress liner layer would now be applied overlying the gate and the silicided source and drain regions. The stress liner would be planarized, for example by CMP, to expose the top of the dummy gate electrode and to reduce the gate electrode aspect ratio (i.e., the ratio of the height of the gate electrode to its width). Unfortunately when the stress liner is planarized and is thus made discontinuous, the beneficial advantages of using the stress liner are lost.

Figure 6:
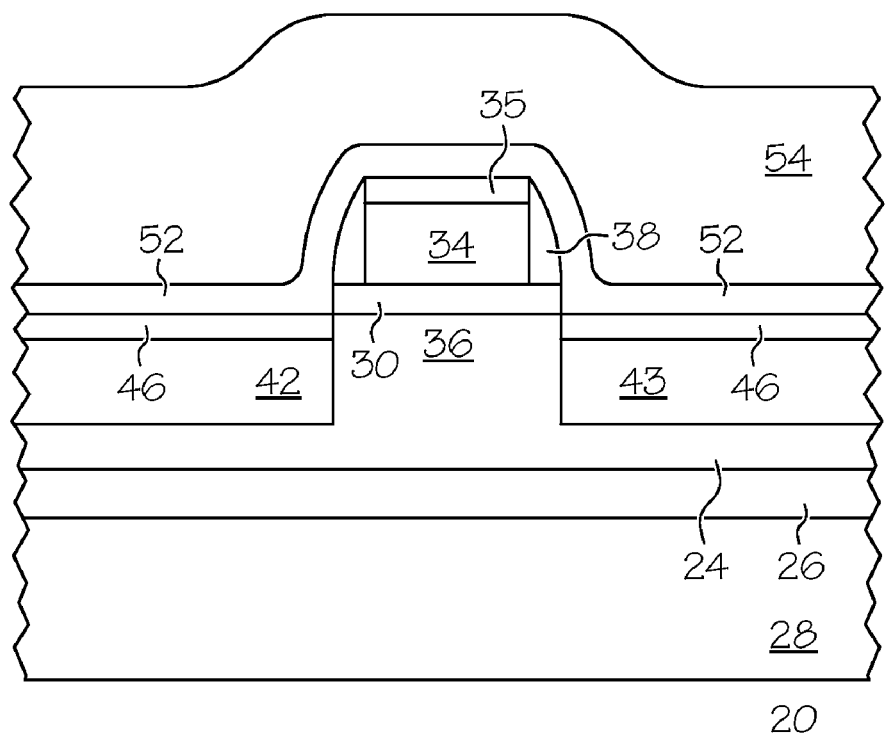

Accordingly, in accordance with an embodiment of the invention, a buffer layer 52, as illustrated in FIG. 6 is deposited overlying the gate electrode and the silicided source and drain regions. The buffer layer is a layer of dielectric material such as a layer of silicon nitride. The layer of silicon nitride, in accordance with one embodiment of the invention is a stressed layer of silicon nitride. For a PMOS transistor the layer of stressed silicon nitride is compressive stressed and for an NMOS transistor is tensile stressed. Buffer layer 52 can be deposited by LPCVD or PECVD to a thickness of about 20 nm. A second layer of dielectric material 54 such as a layer of silicon oxide is deposited over the buffer layer. Layer 54 can also be deposited by LPCVD or PECVD and is deposited to a thickness in excess of the thickness of gate electrode 34.

Figure 7:
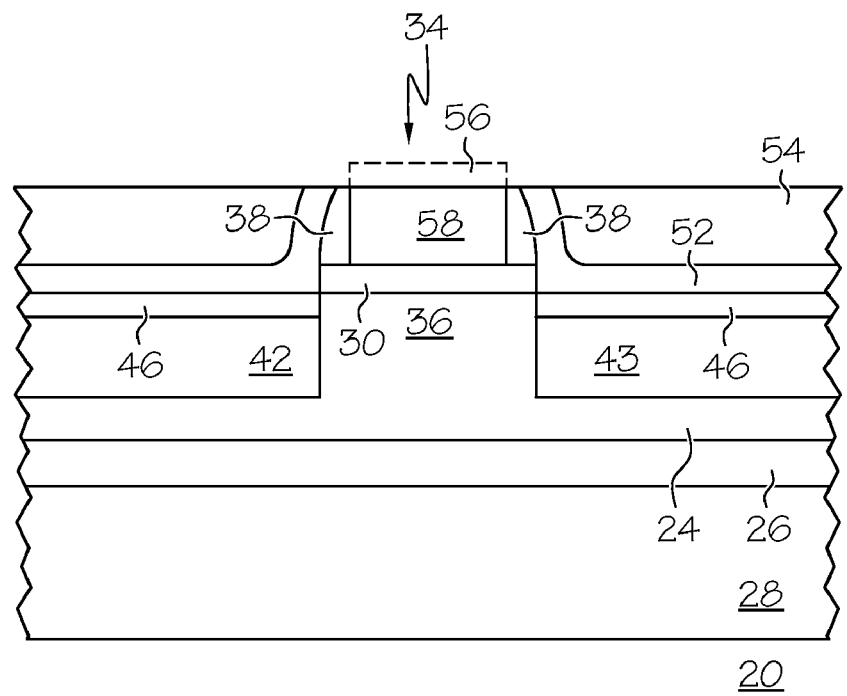
Figure 8:
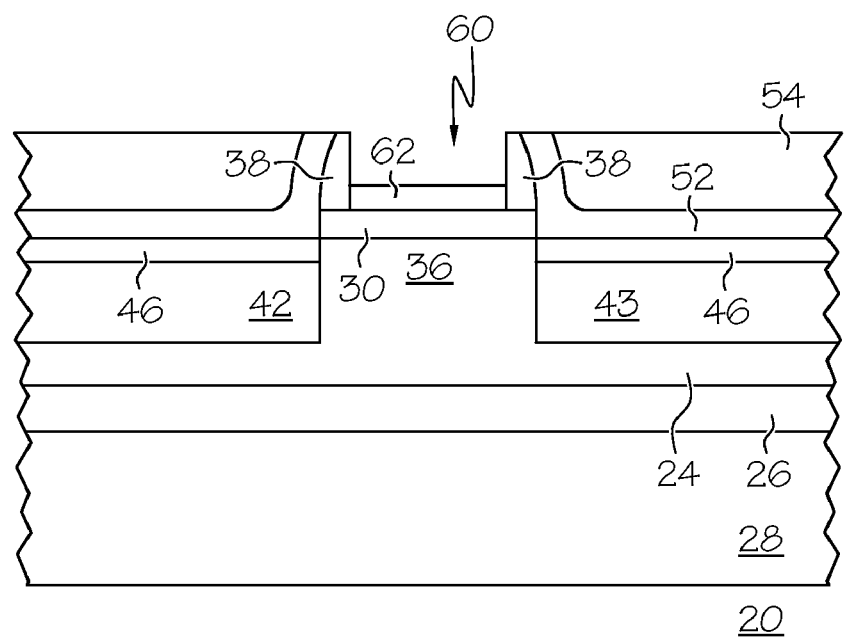

Dielectric layer 54, buffer layer 52 and the top portion 56 (shown in dashed lines) of dummy gate electrode 34 are planarized, for example by CMP, as illustrated in FIG. 7. The planarization reduces the gate electrode aspect ratio. Preferably the remaining portion 58 of dummy gate electrode 34 has a height of about 70-150 nm. As illustrated in FIG. 8, the remaining portion of the dummy gate electrode or at least the majority of it is removed, preferably by plasma etching leaving a void 60 bounded on the edges by side wall spacers 38. A thin portion 62, about 10-20 nm, of remaining portion 58 may be left as illustrated in the figure. Thin remaining portion 62, appropriately doped with conductivity determining impurities to have the desired work function, helps in establishing the threshold voltage of MOS transistor 20. Although not illustrated, if the entire dummy gate electrode is removed, gate insulator layer 30 may be removed and subsequently replaced by a permanent gate insulator.

Figure 9:
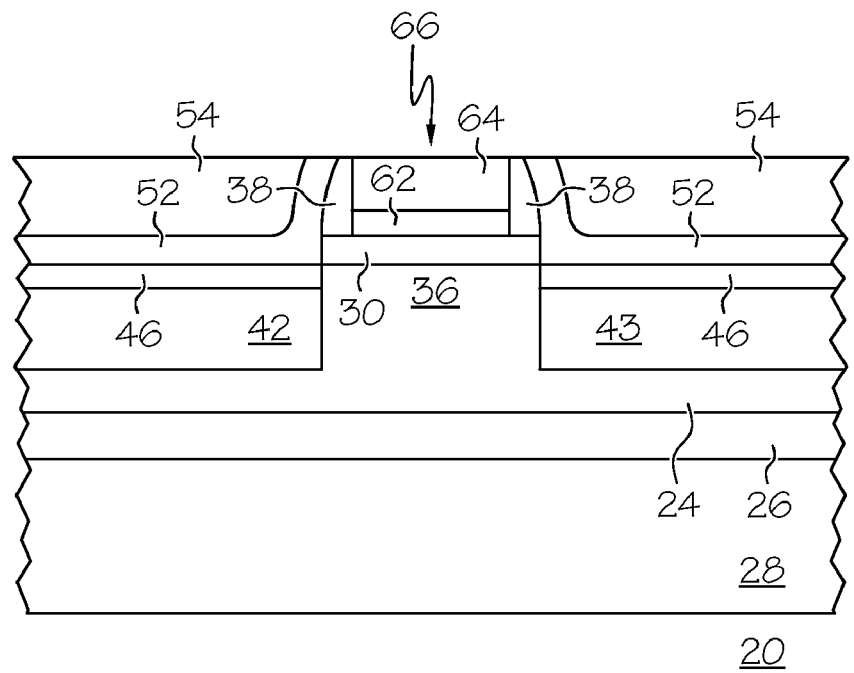

The method continues, in accordance with an embodiment of the invention by depositing a stressed layer (not illustrated) of conductive gate electrode material to fill void 60. The stressed layer can be a layer of stressed metal, metal nitride, or the like. For a PMOS transistor the stressed material is tensile stressed and for an NMOS transistor the stressed material is compressive stressed. The layer of stressed material can be deposited, for example, by physical vapor deposition (PVD) or CVD with the deposition conditions adjusted to cause the deposited material to be appropriately stressed. The layer of stressed material is polished by CMP to remove excess material from the planarized surface of dielectric layer 54 and buffer layer 52 leaving stressed material 64 filling void 60 and forming, together with thin remaining portion 62, if such a portion was left, a permanent stressed gate electrode 66 as illustrated in FIG. 9. If thin remaining portion 62 was left after etching dummy gate electrode 34, that portion of the gate electrode is effective in determining the threshold voltage of MOS transistor and a wide variety of materials such as stressed titanium nitride can be used as stressed material 64 without regard to the work function of the stressed material. If dummy gate 34 was entirely removed, stressed material 64 must be selected from materials having the correct work function in addition to being either compressive or tensile stressed. The stressed gate electrode induces a stress in the channel of MOS transistor 20 that enhances the mobility of majority carriers in the channel.

Figure 10:
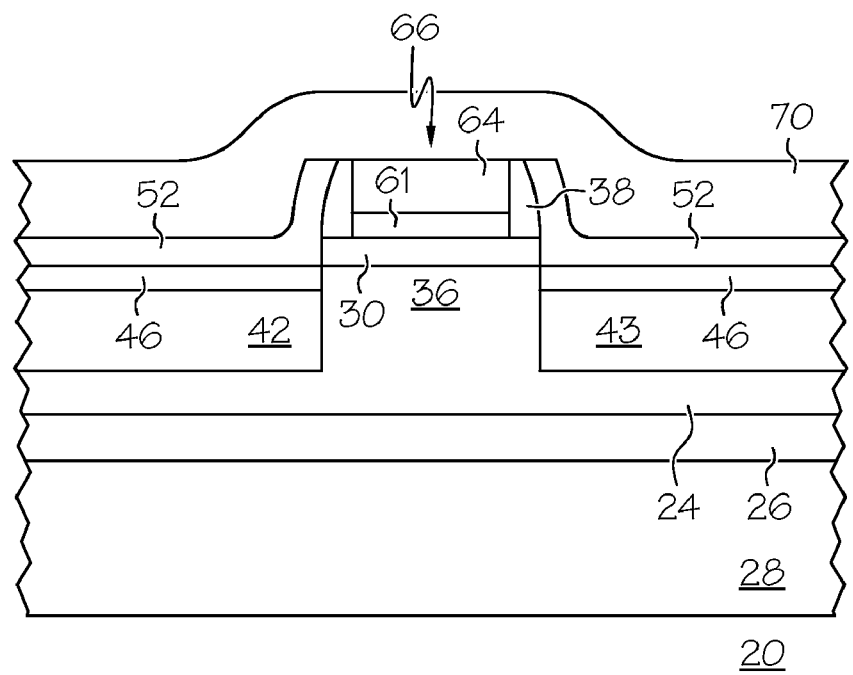

After polishing the layer of stressed gate electrode material, dielectric layer 54 is removed, for example by wet etching using buffer layer 52 as an etch stop. For example, if dielectric layer 54 is a silicon oxide and buffer layer 52 is silicon nitride, layer 54 can be removed by etching in a hydrofluoric acid solution. During the etching process buffer layer 52 acts as an etch stop layer and protects metal silicide layer 46. A stress liner layer 70 is deposited overlying stressed gate electrode 66 and buffer layer 52 as illustrated in FIG. 10. For a PMOS transistor the stressed liner layer is compressive stressed; for an NMOS transistor the stressed liner is tensile stressed. The stressed liner can be, for example, a stressed layer of silicon nitride. The layer of silicon nitride can be deposited, for example, by LPCVD or PECVD from reactants including dichlorosilane and ammonia. The deposition conditions, reactants, and reactant flows can be adjusted, as is well known, to deposit either a tensile stress liner or a compressive stress liner. The stressed liner is preferably deposited to a thickness of about 50 nm. The stressed liner induces a stress in channel 36 of MOS transistor that enhances the mobility of majority carriers in the channel. The stress induced by the stress liner reinforces the stress induced by stressed gate electrode 66 and the stress induced by the embedded SiGe or SiC in the source and drain regions.

In accordance with a further embodiment of the invention (not illustrated), the same method may be employed as illustrated and described above but without depositing buffer layer 52. Dielectric layer 54 is deposited directly on metal silicide layer 46 and on dummy gate electrode 34. Care must be exercised in removing dielectric layer 54 after planarizing the layer of stressed gate electrode material so as not to damage metal silicide layer 46.

Although not illustrated, stress enhanced MOS transistor 20 is completed in conventional manner by providing electrical contacts to metal silicide layer 46 contacting source region 42 and drain region 43, and to permanent gate electrode 66. The conventional processing may include, for example, depositing interlayer dielectrics, etching contact vias, filling the contact vias with conductive plugs, and the like as are well known to those of skill in the art of fabricating semiconductor circuits.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method for fabricating a stress enhanced MOS transistor comprising the steps of:
    forming a dummy gate electrode overlying a semiconductor substrate;
    forming side wall spacers on the dummy gate electrode;
    forming source and drain regions in the semiconductor substrate;
    depositing a dielectric buffer layer overlying the gate electrode, side wall spacers, and source and drain regions;
    forming a dielectric material overlying the dielectric buffer layer;
    polishing the dielectric buffer layer and the dielectric material to expose and remove a top portion of the dummy gate electrode and to leave a remaining portion of the dummy gate electrode;
    removing at least a portion of the dummy gate electrode to leave a void;
    depositing a stressed conductive layer to fill the void;
    polishing the stressed conductive layer to form a stressed gate electrode;
    removing the dielectric material; and
    depositing a stressed liner overlying the stressed gate electrode.

2. The method of claim 1 wherein the step of forming a dummy gate electrode comprises the steps of depositing and patterning a layer of polycrystalline silicon.

3. The method of claim 1 wherein the semiconductor substrate comprises a silicon substrate and wherein the method further comprises the steps of:
    etching a recess into the silicon substrate in alignment with an edge of the dummy gate electrode; and
    filling the recess by selective epitaxial growth of a monocrystalline material selected from the group consisting of silicon germanium and silicon carbon.

4. The method of claim 1 wherein the step of depositing a stressed conductive layer comprises the step of depositing a stressed titanium nitride layer.

5. The method of claim 1 wherein the step of depositing a stressed liner comprises the step of depositing a stressed silicon nitride liner.

6. The method of claim 1 further comprising the step of forming a metal silicide layer in contact with the source and drain regions.

7. The method of claim 6 wherein the step of depositing a dielectric buffer layer comprises the step of depositing a layer of silicon nitride overlying the metal silicide layer.

8. The method of claim 7 wherein the step of forming a dielectric material comprises forming a silicon oxide overlying the layer of silicon nitride.

9. The method of claim 8 wherein the step of removing the dielectric material comprises etching the dielectric material and stopping on the buffer layer.

10. A method for fabricating a stress enhanced MOS transistor comprising the steps of:
    forming a dummy gate electrode;
    depositing and etching a layer of dielectric material to form side wall spacers on the dummy gate electrode;
    depositing a buffer layer comprising a first dielectric material overlying the side wall spacers and the dummy gate electrode;
    depositing a dielectric layer comprising a second dielectric material different than the first dielectric material overlying the buffer layer;
    removing at least a portion of the dummy gate electrode;
    replacing the at least a portion of the dummy gate electrode with a stressed gate electrode;
    removing the dielectric layer; and
    depositing a stress liner overlying the stressed gate electrode.

11. The method of claim 10
    wherein the step of removing at least a portion of the dummy gate electrode comprises chemical mechanical polishing the dielectric layer and the buffer layer to planarize the dielectric layer and to expose a portion of the dummy gate electrode.

12. The method of claim 11 wherein the step of chemical mechanical polishing further comprises the step of chemical mechanical polishing the dummy gate electrode to reduce the height thereof.

13. The method of claim 11 wherein the step of removing at least a portion of the dummy gate electrode comprises the step of removing at least a portion of the dummy gate electrode to form a void and wherein the step of replacing the at least a portion of the dummy gate electrode comprises the steps of:
    depositing a layer of stressed conductive material overlying the planarized second dielectric layer and filling the void; and
    chemical mechanical polishing the layer of stressed conductive material to remove the layer of stressed conductive material from the planarized second dielectric layer.

14. The method of claim 13 wherein the step of depositing a layer of stressed conductive material comprises the step of depositing a layer of stressed titanium nitride.

15. The method of claim 10 wherein the step of depositing a stress liner comprises the step of depositing a layer of stressed silicon nitride.

16. A method for fabricating a stress enhanced MOS transistor comprising the steps of:
    depositing and patterning a layer of sacrificial material to form a dummy gate electrode;
    depositing a buffer layer comprising a first dielectric material overlying the dummy gate electrode;
    depositing a dielectric layer comprising a second dielectric material different than the first dielectric material overlying the buffer layer;
    removing a portion of the dielectric layer and the buffer layer to expose the dummy gate electrode;
    replacing at least a portion of the dummy gate electrode with a stressed gate electrode;
    removing the dielectric layer; and
    depositing a stressed liner layer overlying the stressed gate electrode.

17. The method of claim 16 wherein the step of depositing and patterning comprises the step of depositing and patterning a layer of polycrystalline silicon overlying a monocrystalline silicon substrate and further comprising the step of:
    etching a recess into the monocrystalline silicon substrate adjacent the dummy gate electrode; and
    filling the void by epitaxially growing a monocrystalline material selected from the group consisting of silicon germanium and silicon carbon.

18. The method of claim 16 further comprising the steps of:
    forming side wall spacers on the dummy gate electrode;
    wherein the buffer layer is formed overlying the sidewall spacers.

19. The method of claim 16 wherein the step of depositing a buffer layer comprises the step of depositing a first stress liner comprising a layer of stressed silicon nitride.

20. The method of claim 19
wherein the step of depositing a dielectric layer comprises depositing an oxide layer overlying the buffer layer,
wherein the step of removing a portion of the dielectric layer and the buffer layer comprise the step of chemical mechanical polishing the oxide layer and the buffer layer to expose a portion of the dummy gate electrode; and
wherein the step of removing the dielectric layer comprises etching the oxide layer using the buffer layer as an etch stop.

* * * * *